United States Patent
Steiner (10) Patent No.: US 10,935,565 B2
(45) Date of Patent: Mar. 2, 2021

(54) DETECTING CONTAMINATION OF A PRESSURE SENSOR BASED ON CROSS-SENSITIVITY TO ACCELERATION

(71) Applicant: Infineon Technologies AG, Neubiberg (DE)

(72) Inventor: Christoph Steiner, St. Margarethen (AT)

(73) Assignee: Infineon Technologies AG, Neubiberg (DE)

( * ) Notice: Subject to any disclaimer, the term of this patent is extended or adjusted under 35 U.S.C. 154(b) by 163 days.

(21) Appl. No.: 16/291,850

(22) Filed: Mar. 4, 2019

(65) Prior Publication Data

US 2020/0284821 A1    Sep. 10, 2020

(51) Int. Cl.
*G01P 15/08* (2006.01)
*B81B 7/02* (2006.01)
*G01L 9/00* (2006.01)

(52) U.S. Cl.
CPC ............ *G01P 15/0802* (2013.01); *B81B 7/02* (2013.01); *G01L 9/0005* (2013.01); *G01L 9/0042* (2013.01); *G01L 9/0054* (2013.01)

(58) Field of Classification Search
CPC ....... B81B 7/02; G01L 9/0054; G01L 9/0042; G01L 9/0005; G01P 15/0802
USPC .......................................................... 73/1.38
See application file for complete search history.

(56) References Cited

U.S. PATENT DOCUMENTS

| 5,974,898 | A  * | 11/1999 | Golderer | G01L 1/142 73/862.043 |
| 6,422,088 | B1 * | 7/2002  | Oba      | G01D 3/08 73/754 |
| 9,664,584 | B2 * | 5/2017  | Ten Kate | G01L 7/00 |
| 2004/0055385 | A1 * | 3/2004 | Kolb | G01P 15/125 73/715 |

FOREIGN PATENT DOCUMENTS

WO    WO-2009101566 A1 *   8/2009   ............. G01L 19/02

OTHER PUBLICATIONS

English translation of WO2009101566 accessed from patentscope.wipo.com Oct. 19, 2020.*

* cited by examiner

*Primary Examiner* — Nimeshkumar D Patel
*Assistant Examiner* — Jean F Morello
(74) *Attorney, Agent, or Firm* — Harrity & Harrity, LLP (57) ABSTRACT

A contamination detector device may compute a cross-sensitivity of a pressure sensor based on an amount of pressure change sensed by the pressure sensor and an amount of acceleration change sensed by an acceleration sensor. The cross-sensitivity of the pressure sensor indicates a measure of sensitivity of the pressure sensor to acceleration. The contamination detector device may determine, based on the cross-sensitivity of the pressure sensor, whether the pressure sensor is contaminated. The contamination detector device may selectively perform a contamination action based on whether the pressure sensor is contaminated.

20 Claims, 8 Drawing Sheets

Environment

DETECTING CONTAMINATION OF A PRESSURE SENSOR BASED ON CROSS-SENSITIVITY TO ACCELERATION

BACKGROUND

A pressure sensor is a device capable of sensing an amount of pressure and providing a signal that represents the sensed amount of pressure. The pressure sensor may be, for example, a micro-electro-mechanical system (MEMS) sensor that includes a pressure-sensitive mechanical structure in the form of a membrane. The membrane is coupled to an electrical transducer system (e.g., based on capacitance-detection or piezoresistance) in order to provide the pressure sensing functionality.

SUMMARY

According to possible implementations, a method may include: computing, by a device, a cross-sensitivity of a pressure sensor based on an amount of pressure change sensed by the pressure sensor and an amount of acceleration change sensed by an acceleration sensor, wherein the cross-sensitivity of the pressure sensor indicates a measure of sensitivity of the pressure sensor to acceleration; determining, by the device and based on the cross-sensitivity of the pressure sensor, whether the pressure sensor is contaminated; and selectively performing, by the device, a contamination action based on whether the pressure sensor is contaminated.

According to possible implementations, a contamination detector device may include one or more memories and one or more processors, communicatively coupled to the one or more memories, to: compute a cross-sensitivity of a pressure sensor, the cross-sensitivity indicating a measure of sensitivity of the pressure sensor to acceleration experienced by the pressure sensor, wherein the cross-sensitivity is determined based on an amount of pressure change sensed by the pressure sensor and an amount of acceleration change sensed by an acceleration sensor; determine whether the pressure sensor is contaminated based on comparing the cross-sensitivity and a cross-sensitivity threshold; and selectively perform a contamination action based on whether the pressure sensor is contaminated.

According to possible implementations, a system may include: a pressure sensor; an acceleration sensor; and a contamination detector device to: compute a cross-sensitivity of the pressure sensor based on an amount of pressure changed, determined based on measurements by the pressure sensor, and an amount of acceleration change determined based on measurements by the acceleration sensor, wherein the cross-sensitivity indicates a measure of sensitivity of the pressure sensor to acceleration; determine whether the pressure sensor is contaminated based on the cross-sensitivity of the pressure sensor; and selectively perform a contamination action based on whether the pressure sensor is contaminated.

DETAILED DESCRIPTION

The following detailed description of example implementations refers to the accompanying drawings. The same reference numbers in different drawings may identify the same or similar elements.

A pressure-sensitive mechanical structure of a MEMS pressure sensor (e.g., a membrane) is typically exposed to the environment since air (or other substance) must be able to interact with the pressure-sensitive mechanical structure in order for the pressure sensor to perform pressure sensing associated with the environment. However, in some applications, the environment includes matter that causes adverse effects on accuracy and reliability of the pressure sensor. For example, the environment can include a contaminate (e.g., a particle, a low-viscosity liquid, and/or the like), that can contaminate the pressure-sensitive mechanical structure of the pressure sensor (e.g., due to presence or buildup of the contaminate on the pressure-sensitive mechanical structure). This contamination causes the pressure sensor to provide inaccurate and unreliable pressure measurements. Automotive applications, such as a tire pressure monitoring system (TPMS) application or an air bag sensor application, are examples of applications in which this contamination issue may arise.

Prior techniques to address contamination of a pressure sensor are designed to prevent contamination. For example, in some cases, a gel can be applied to the pressure-sensitive mechanical structure in order to attempt to prevent contamination. As another example, a particle reservoir can be integrated in the pressure sensor in order to attempt to prevent contamination (e.g., by capturing matter in the particle reservoir). However, these prior techniques are designed only to prevent contamination, and not to actually detect contamination. Therefore, if these prior techniques fail or are ineffective, contamination goes undetected. Further, these prior techniques increase cost and complexity of the pressure sensor (e.g., by requiring application of gel, by requiring inclusion of a reservoir).

Some implementations described herein provide a contamination detector device capable of detecting contamination of a pressure sensor. In some implementations, the contamination detector device detects whether the pressure sensor is contaminated based on cross-sensitivity of the pressure sensor to acceleration, as described below. In some implementations, the contamination detector device may selectively perform a contamination action based on whether the pressure sensor is contaminated.

Figure 1:
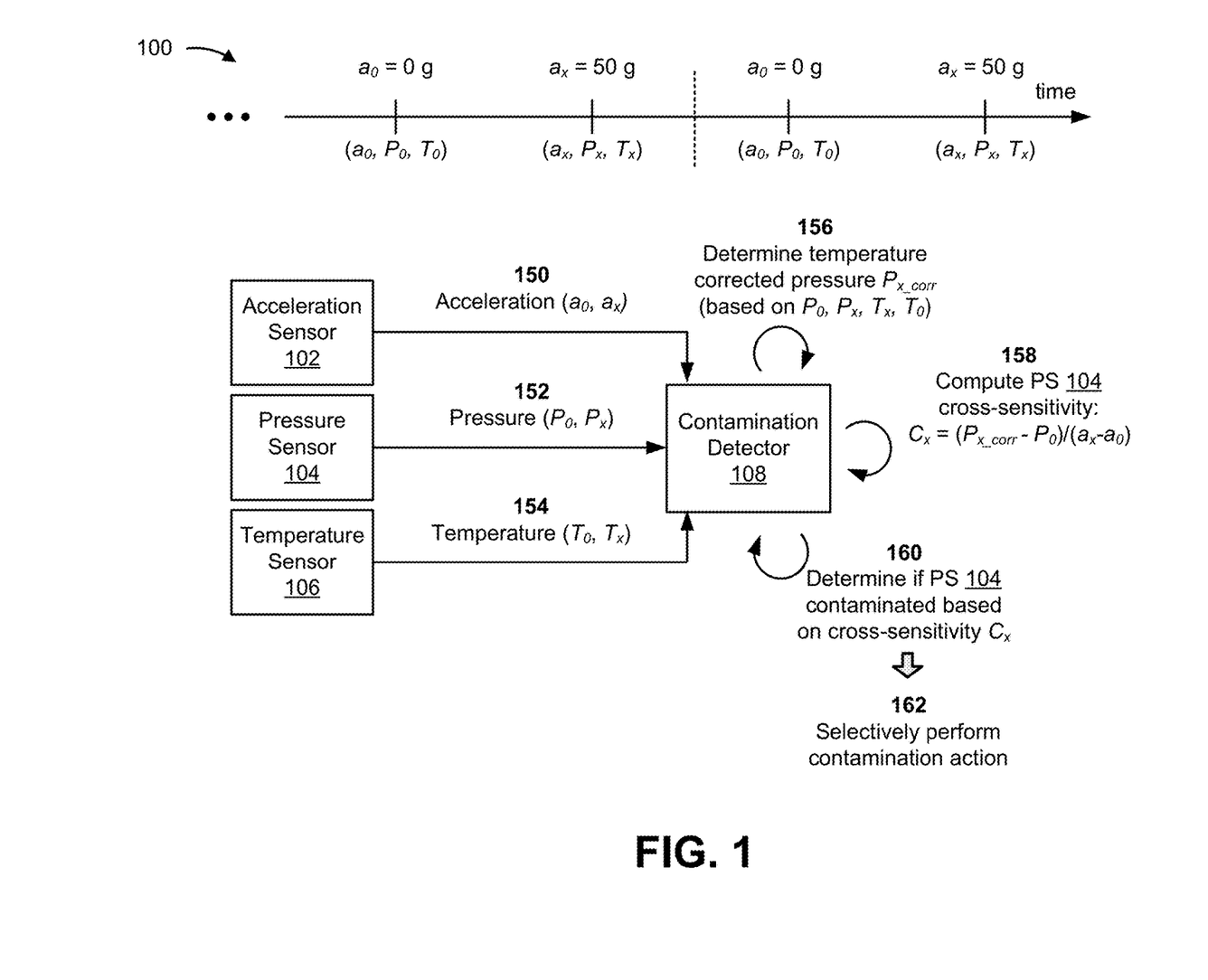
FIG. 1 is a diagram of an example implementation of detecting contamination of a pressure sensor based on cross-sensitivity to acceleration, as described herein.

FIG. 1 is a diagram of an example implementation of detecting contamination of a pressure sensor based on cross-sensitivity to acceleration, as described herein.

In FIG. 1, a system 100 includes an acceleration sensor 102 (e.g., a MEMS accelerometer) capable of sensing an amount of acceleration, a pressure sensor 104 (e.g., a MEMS pressure sensor) capable of sensing an amount of pressure, and a temperature sensor 106 capable of sensing a temperature at or near pressure sensor 104. As further shown, system 100 further includes a contamination detector device 108 capable of detecting contamination of pressure sensor 104, as described herein.

In some implementations, contamination detector device 108 may determine whether pressure sensor 104 is contaminated based on cross-sensitivity of pressure sensor 104 to acceleration. Pressure sensor 104 may have a cross-sensitivity to acceleration even when the pressure-sensitive mechanical structure is not contaminated. In other words, even when pressure sensor 104 is not contaminated, a pressure sensed by pressure sensor 104 may be sensitive to acceleration at pressure sensor 104. When pressure sensor 104 is not contaminated, this cross-sensitivity may be insignificant (e.g., such that pressure measurements by pressure sensor 104 are still reliable). However, if the pressure-sensitive mechanical structure of pressure sensor 104 is contaminated (e.g., during operation in the field), then the cross-sensitivity of pressure sensor 104 to acceleration changes and may become significant (e.g., such that pressure measurements by pressure sensor 104 are unreliable). The contamination of the pressure sensor 104 can be detected by monitoring the cross-sensitivity of pressure sensor 104.

Contamination detector device 108 is a device capable of detecting contamination of pressure sensor 104. In some implementations, contamination detector device 108 may be integrated with pressure sensor 104, or may be a separate device.

In some implementations, contamination detector device 108 may detect contamination of pressure sensor 104 based on a reference measurement (e.g., a pressure measurement performed when an amount of acceleration sensed by acceleration sensor 102 is approximately equal to 0 gravities (g)) and a test measurement (e.g., a pressure measurement performed when an amount of acceleration sensed by acceleration sensor 102 is greater than 0 g, such as 50 g).

In some implementations, as shown in FIG. 1, information associated with the reference measurement may include information that identifies the reference acceleration $a_0$ (e.g., 0 g), information that identifies a reference pressure $P_0$ (e.g., information that identifies an amount pressure measured by pressure sensor 104 when experiencing the reference acceleration $a_0$), and information that identifies a reference temperature $T_0$ (e.g., information that identifies a temperature measured by temperature sensor 106 at the time of the reference pressure measurement by pressure sensor 104). Similarly, as shown in FIG. 1, information associated with the test measurement may include information that identifies the test acceleration $a_0$ (e.g., 50 g), information that identifies a test pressure $P_x$ (e.g., information that identifies an amount pressure measured by pressure sensor 104 when experiencing the test acceleration $a_x$), and information that identifies a test temperature $T_x$ (e.g., information that identifies a temperature measured by temperature sensor 106 at the time of the test pressure measurement by pressure sensor 104).

As shown in FIG. 1, and by reference number 150, contamination detector device 108 may receive, from acceleration sensor 102, an acceleration signal that identifies the reference acceleration $a_0$ sensed by acceleration sensor 102 (at a time $t_0$) and the test acceleration $a_x$ sensed by acceleration sensor 102 (at a time $t_x$). As shown by reference number 152, contamination detector device 108 may also receive, from pressure sensor 104, a pressure signal that identifies an amount of reference pressure $P_0$ sensed by pressure sensor 104 (at the time to when pressure sensor 104 was experiencing reference acceleration $a_0$) and an amount of test pressure $P_x$ sensed by pressure sensor 104 (at the time $t_x$ when pressure sensor 104 was experiencing test acceleration $a_x$). As shown by reference number 154, contamination detector device 108 may also receive, from temperature sensor 106, a temperature signal that identifies a reference temperature $T_0$ sensed by temperature sensor 106 (at the time to when pressure sensor 104 measured reference pressure $P_0$) and a test temperature $T_x$ sensed by temperature sensor 106 (at the time $t_x$ when pressure sensor 104 measured reference pressure $P_0$).

In some implementations, contamination detector device 108 may receive the acceleration signal, the pressure signal, or the temperature signal based on a request provided to acceleration sensor 102, pressure sensor 104, or temperature sensor 106, respectively. Additionally, or alternatively, contamination detector device 108 may automatically receive the acceleration signal, the pressure signal, and/or the temperature signal (e.g., when acceleration sensor 102, pressure sensor 104, and/or temperature sensor 106, are configured to provide the respective signals automatically on a periodic basis).

As shown by reference number 156, in some implementations, contamination detector device 108 may determine a temperature corrected pressure $P_{x\_corr}$ (e.g., based on the test pressure $P_x$, the test temperature $T_x$, the reference pressure $P_0$ and the reference temperature $T_0$. For example, contamination detector device 108 may correct the pressure $P_x$ as identified in the pressure signal (e.g., a sensed amount of pressure) based on a difference between the test temperature $T_x$ identified in the temperature signal and the reference temperature $T_0$. In some implementations, correction of the test pressure $P_x$ may be needed since a pressure at pressure sensor 104 depends on temperature at pressure sensor 104. In other words, without temperature correction, a cross-sensitivity of pressure sensor 104 determined by contamination detector device 108 may not be sufficient for comparison with a calibration cross-sensitivity determined at a different temperature and, therefore, a determination of whether pressure sensor 104 is contaminated may not be sufficiently reliable. In some implementations, contamination detector device 108 may determine the temperature corrected pressure $P_{x\_corr}$ in a typical manner (e.g., based on the ideal gas law). For example, the test pressure Px may be multiplied by the reference temperature T0 and divided by the test temperature Tx, a result of which is the temperature corrected pressure $P_{x\_corr}$.

As further shown in FIG. 1, and by reference number 158, contamination detector device 108 may compute a cross-sensitivity $C_x$ of pressure sensor 104 based on the temperature corrected pressure $P_{x\_corr}$, the test acceleration $a_x$, the reference pressure $P_0$, and the reference acceleration $a_0$. Here, the cross-sensitivity $C_x$ of pressure sensor 104 indicates a measure of sensitivity of pressure sensor 104 to acceleration at the time $t_x$.

In some implementations, when computing the cross-sensitivity $C_x$ of pressure sensor 104, contamination detector device 108 may determine a pressure difference between the temperature corrected pressure $P_{x\_corr}$ and the reference pressure $P_0$, and may determine an acceleration difference between the acceleration $a_x$ and the reference acceleration $a_0$. As indicated in FIG. 1, contamination detector device 108 may determine the cross-sensitivity $C_x$ as a result of dividing the pressure difference by the acceleration difference. The unit of the cross-sensitivity $C_x$ may be, for example, pascals per gravity (Pa/g) or pascals per meter per second squared (m/s$^2$).

In some implementations, contamination detector device 108 may compute the cross-sensitivity $C_x$ of pressure sensor 104 based on determining that the acceleration $a_x$ satisfies an acceleration threshold. For example, pressure sensor 104 may be configured with an acceleration threshold (e.g., 50 g). Here, upon receiving the acceleration signal (e.g., as described above in association with reference number 150), contamination detector device 108 may determine whether the acceleration $a_x$ satisfies the acceleration threshold (e.g., whether pressure sensor 104 is experiencing at least 50 g of acceleration). In this example, if the acceleration $a_x$ satisfies the acceleration threshold, then contamination detector device 108 may proceed with computing the cross-sensitivity $C_x$. Conversely, if the acceleration $a_x$ does not satisfy the acceleration threshold, then contamination detector device 108 may not proceed with computing the cross-sensitivity $C_x$, and may await receipt of a next acceleration signal from acceleration sensor 102. In this way, contamination detector device 108 may be configured to perform contamination detection on a relatively limited basis, which conserves processing and power resources of contamination detector device 108.

As further shown in FIG. 1, and by reference number 160, contamination detector device 108 may determine, based on the cross-sensitivity $C_x$ of pressure sensor 104, whether pressure sensor 104 is contaminated. For example, in some implementations, contamination detector device 108 may determine whether a difference between the cross-sensitivity $C_x$ and a calibration cross-sensitivity $C_{cal}$ satisfies a cross-sensitivity threshold.

The calibration cross-sensitivity $C_{cal}$ of pressure sensor 104 indicates a measure of sensitivity of pressure sensor 104 to acceleration at a time of calibration. The calibration cross-sensitivity $C_{cal}$ can be configured based on causing pressure sensor 104 to sense a first calibration pressure $P_1$ at a particular temperature Tcal when experiencing a first acceleration $a_1$ (e.g., 0 g), and causing pressure sensor 104 to sense a second calibration pressure $P_2$ at the particular temperature $T_{cal}$ when experiencing a second acceleration $a_2$ (e.g., 100 g). The calibration cross-sensitivity $C_{cal}$ can be determined as a result of dividing a difference between the first pressure $P_1$ and the second pressure $P_2$ by a difference between the first acceleration $a_1$ and the second acceleration $a_2$, a result of which is the calibration cross-sensitivity $C_{cal}$. Notably, the calibration procedure may be performed in a factory in controlled environment and, as a result, is independent from operations in the field.

In some implementations, the calibration procedure may be performed for pressure sensor 104 and, therefore, the calibration cross-sensitivity $C_{cal}$ may be specific to pressure sensor 104. In some implementations, performing the calibration procedure for pressure sensor 104 may improve accuracy of contamination detection associated with pressure sensor 104 (e.g., as compared to storing previously determined values associated with another pressure sensor 104, as described below).

Alternatively, the calibration cross-sensitivity $C_{cal}$ may be associated with one or more other (similar) pressure sensors 104. Here, the calibration cross-sensitivity $C_{cal}$ can be stored on pressure sensor 104 in lieu of performing the calibration procedure specifically for pressure sensor 104. For example, a calibration cross-sensitivity $C_{cal}$ associated with another similar pressure sensor 104 (e.g., resulting from a calibration of the other similar pressure sensor 104) can be stored on pressure sensor 104. In some implementations, storing these predetermined values on pressure sensor 104 (rather than performing the calibration procedure) may reduce cost and complexity of manufacturing pressure sensor 104 (e.g., since the calibration procedure need not be performed).

In some implementations, contamination detector device 108 may determine whether pressure sensor 104 is contaminated based on comparing a difference between the calibration cross-sensitivity $C_{cal}$ and the cross-sensitivity $C_x$ to a cross-sensitivity threshold. The cross-sensitivity threshold is a threshold that identifies a maximum allowable deviation of the cross-sensitivity $C_x$ from the calibration cross-sensitivity $C_{cal}$. In some implementations, the cross-sensitivity threshold may be configured on pressure sensor 104 (e.g., during manufacture, by a controller of pressure sensor 104, and/or the like). Continuing with the above example, if the difference between the cross-sensitivity $C_x$ and the calibration cross-sensitivity $C_{cal}$ satisfies the cross-sensitivity threshold, then contamination detector device 108 may determine that pressure sensor 104 is contaminated (e.g., since the change in cross-sensitivity of pressure sensor 104 to acceleration can be attributed to contamination of pressure sensor 104). Conversely, if the difference between the cross-sensitivity $C_x$ and the calibration cross-sensitivity $C_{cal}$ does not satisfy the cross-sensitivity threshold, then contamination detector device 108 may determine that pressure sensor 104 is not contaminated.

As further shown in FIG. 1, and by reference number 162, contamination detector device 108 may selectively perform a contamination action based on whether pressure sensor 104 is contaminated. For example, if contamination detector device 108 determines that pressure sensor 104 is contaminated (e.g., based on determining that the difference between the cross-sensitivity $C_x$ and the calibration cross-sensitivity $C_{cal}$ satisfies the cross-sensitivity threshold), then contamination detector device 108 may perform the contamination action. Conversely, if contamination detector device 108 determines that pressure sensor 104 is not contaminated (e.g., based on determining that the difference between the cross-sensitivity $C_x$ and the calibration cross-sensitivity $C_{cal}$ does not satisfy the cross-sensitivity threshold), then contamination detector device 108 may not perform the contamination action.

In some implementations, the contamination action may include providing an indication that pressure sensor 104 is contaminated. For example, contamination detector device 108 may set a flag indicating that pressure sensor 104 needs to be replaced or cleaned. Additionally, or alternatively, the contamination action may include initiating performance of contamination compensation associated with pressure sensor 104. For example, pressure sensor 104 and/or contamination detector device 108 may be configured with a contamination compensation algorithm designed to correct a pressure signal, provided by pressure sensor 104, in order to reduce or eliminate the impact of contamination of pressure sensor 104. In some implementations, the contamination compensation algorithm may correct the pressure signal based on the difference between the cross-sensitivity $C_x$ and the calibration cross-sensitivity $C_{cal}$ (i.e., based on the degree to which pressure sensor 104 is impacted by the contamination).

The above-described process can be repeated (e.g., on a periodic basis) for pairs of reference information (e.g., additional values of reference acceleration $a_0$, reference pressure $P_0$, and reference temperature $T_0$) and test information (e.g., additional values of test acceleration $a_x$, test pressure $P_x$, and test temperature $T_x$) in order to allow contamination detector device 108 to continue to detect whether pressure sensor 104 is contaminated.

The number and arrangement of devices shown in FIG. 1 are provided as an example. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. For example, in some implementations, at least two of acceleration sensor 102, pressure sensor 104, or temperature sensor 106 may be integrated in a single device (e.g., on a single chip, in a single package, and/or the like). Further, in some implementations, contamination detector device 108 may be integrated in a device with one or more of acceleration sensor 102, pressure sensor 104, or temperature sensor 106. Additionally, or alternatively, a set of devices (e.g., one or more devices) shown in FIG. 1 may perform one or more functions described as being performed by another set of devices.

Figure 2:
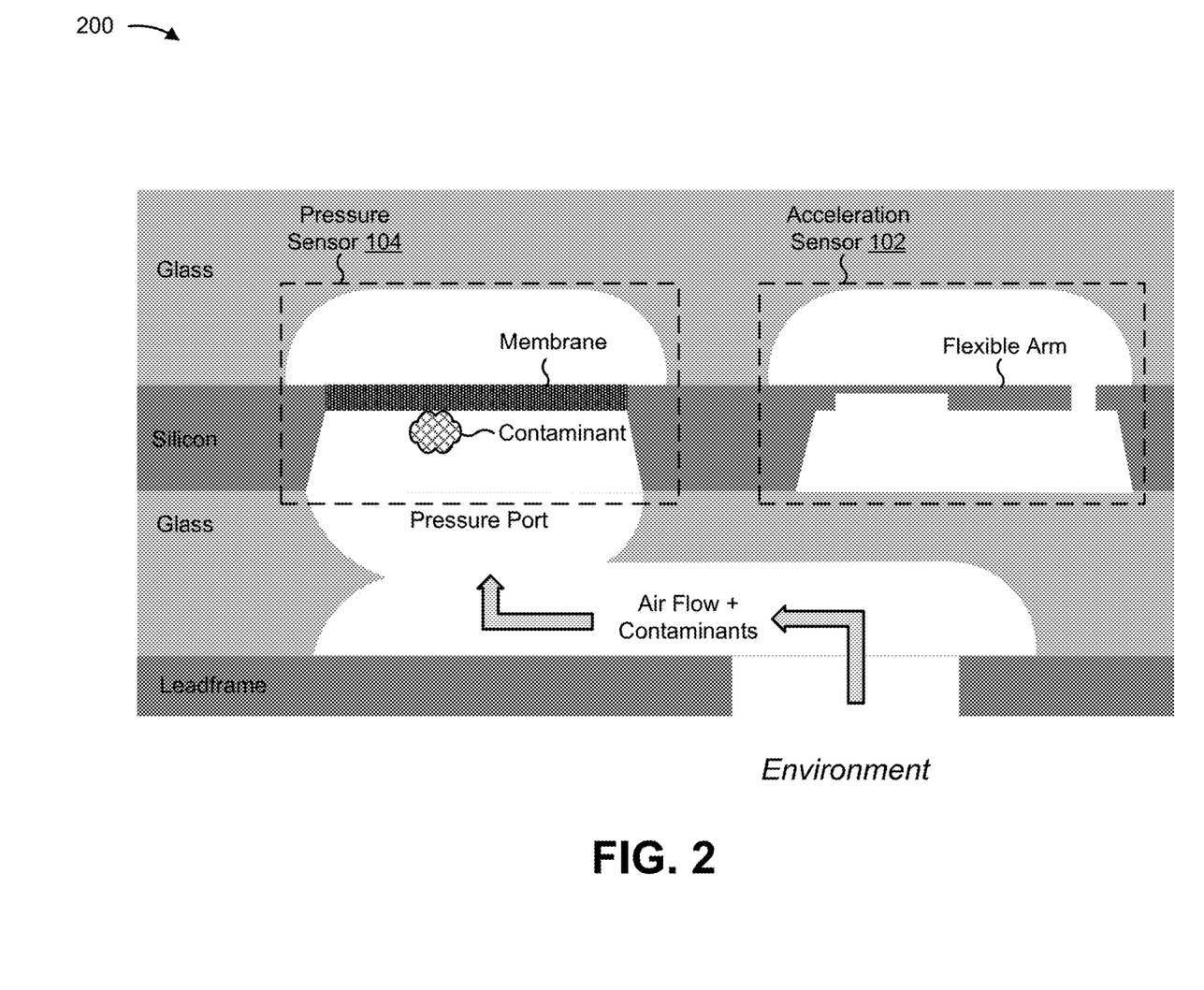
FIG. 2 is a diagram of an example device in which an acceleration sensor and a pressure sensor are integrated in a single device, as described herein.

FIG. 2 is a diagram of an example device 200 in which acceleration sensor 102 and pressure sensor 104 are integrated in a single device. The example shown in FIG. 2 is a case in which pressure sensor 104 and acceleration sensor 102 are manufactured as glass-silicon-glass triple stack. As shown in FIG. 2, pressure sensor 104 may include a pressure-sensitive mechanical structure (e.g., a membrane) and acceleration sensor 102 may include an acceleration-sensitive mechanical structure (e.g., a flexible arm). FIG. 2 further illustrates contamination of pressure sensor 104 (e.g., by a particle) due to exposure to the environment of pressure sensor 104. The presence of the particle on the membrane changes the cross-sensitivity of pressure sensor 104 to acceleration (e.g., in a vertical direction relative to FIG. 2), as described herein.

As indicated above, FIG. 2 is provided merely as an example. Other examples may differ from what is described with regard to FIG. 2.

Figure 3A:
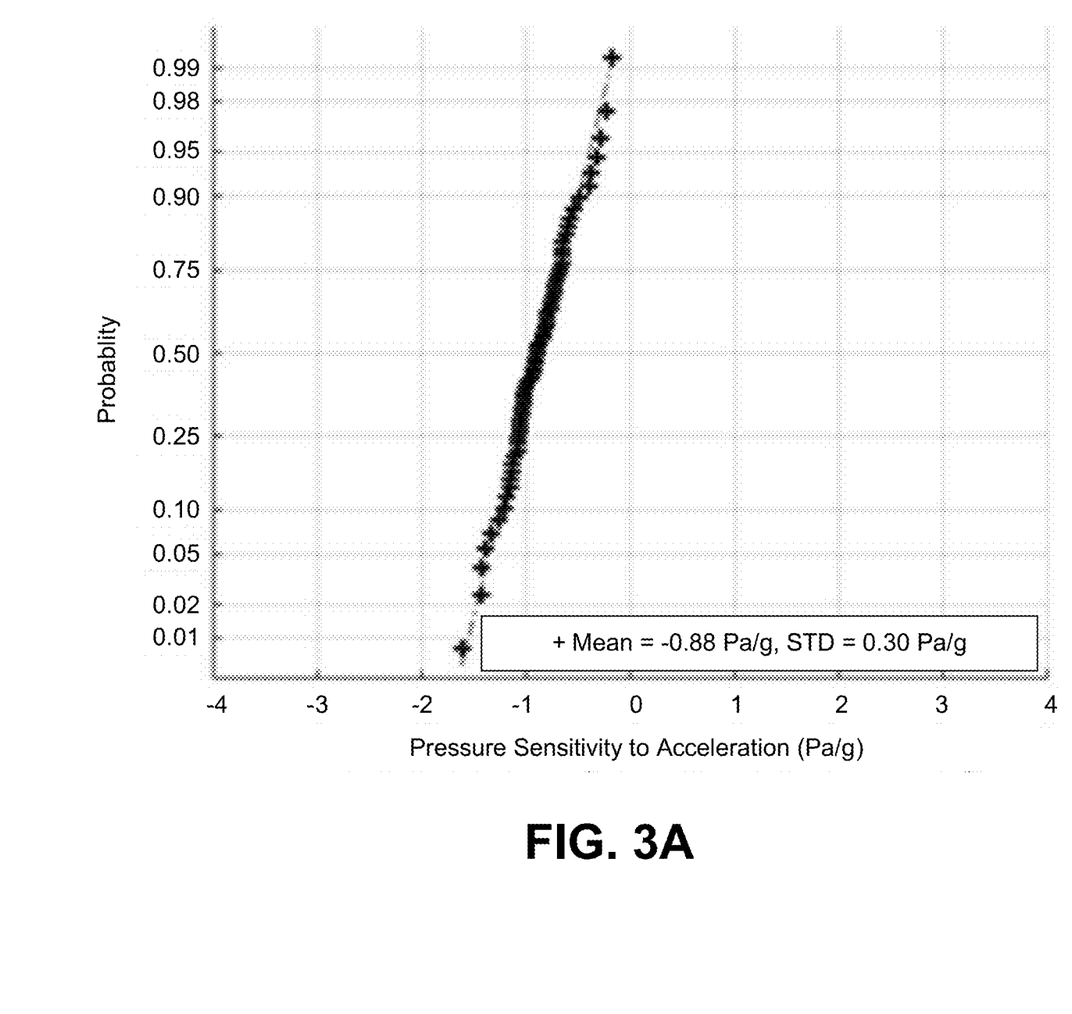
FIGS. 3A-3C are diagrams associated with illustrating that cross-sensitivity to acceleration of a pressure sensor is impacted by contamination of the pressure sensor.
Figure 3B:
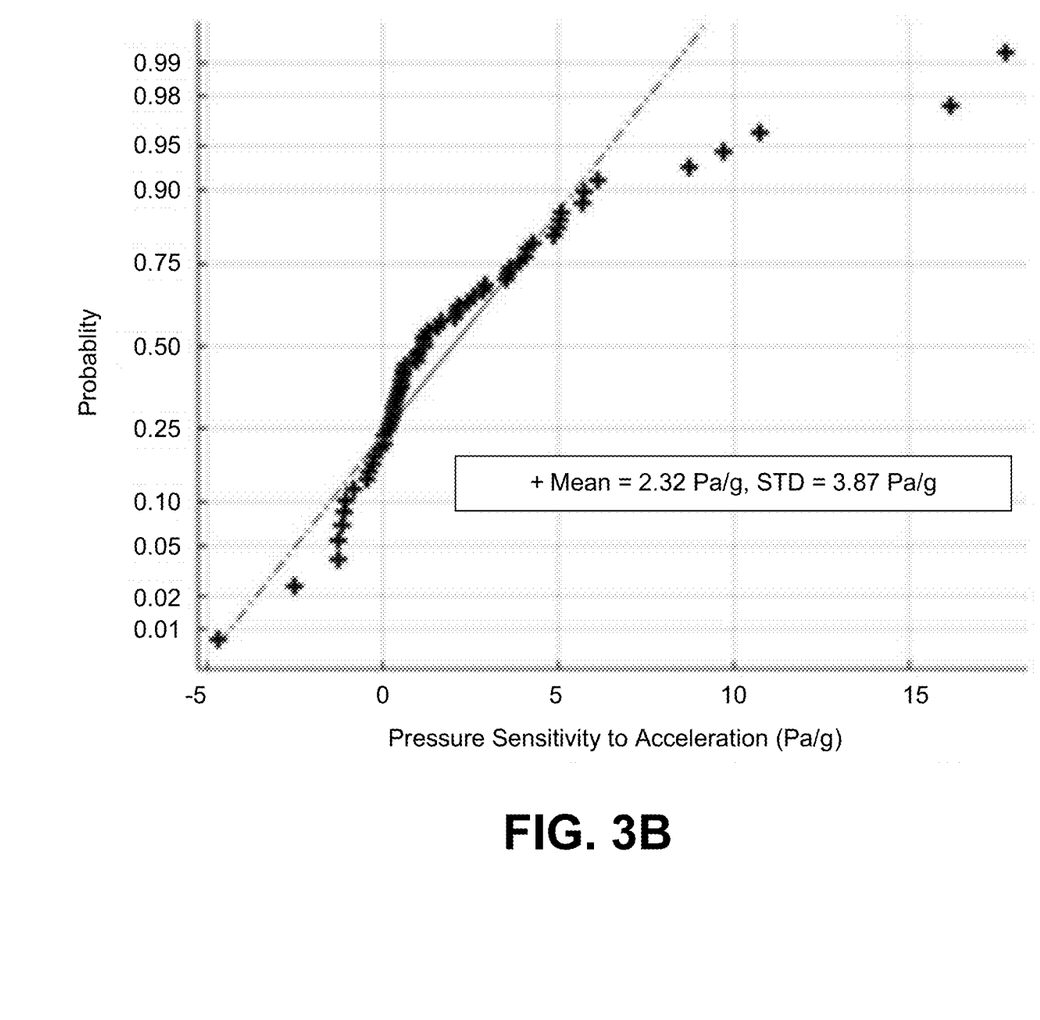
Figure 3C:
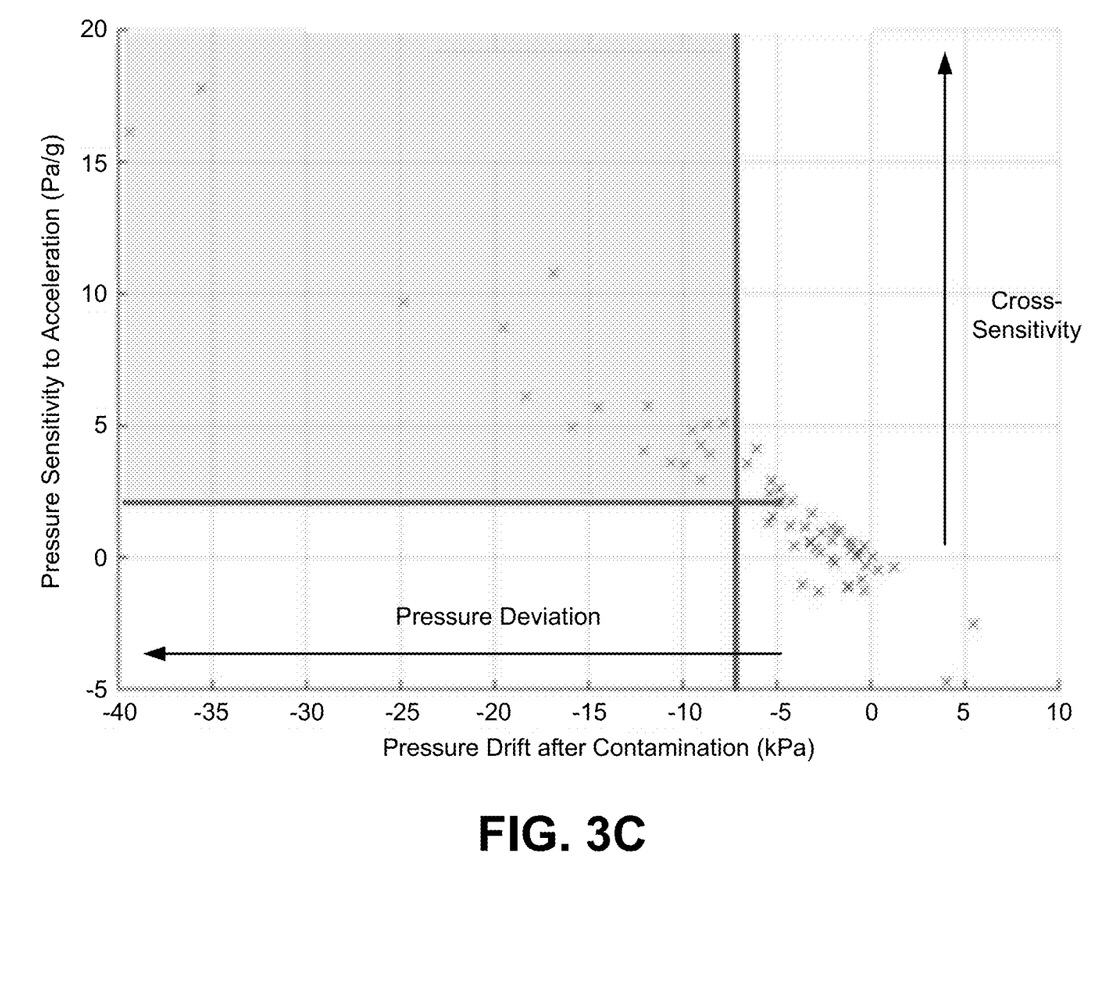

As described above, pressure sensor 104 without contamination may have a cross-sensitivity to acceleration, and the cross-sensitivity to acceleration changes when pressure sensor 104 becomes contaminated. FIGS. 3A-3C are diagrams associated with illustrating that cross-sensitivity to acceleration of pressure sensor 104 is impacted by contamination of pressure sensor 104.

FIGS. 3A and 3B are diagrams of examples illustrating cross-sensitivities of pressure sensor 104 without contamination and with potential contamination, respectively. As shown in FIG. 3A, at a given temperature, a mean cross-sensitivity to acceleration of a group of 77 pressure sensors 104 without contamination was determined to be approximately −0.88 Pa/g, with a standard deviation of approximately 0.30 Pa/g. A contamination was applied to this group of sensors, and FIG. 3B illustrates cross-sensitivities of the group of pressure sensors 104 after the contamination was applied. As shown in FIG. 3B, at the given temperature, a mean cross-sensitivity to acceleration of the group of pressure sensors 104 was determined to be approximately 2.32 Pa/g, with a standard deviation of 3.87 Pa/g. Thus, as described above, it can be concluded that contamination of pressure sensor 104 (e.g., contamination of a pressure-sensitive mechanical structure of pressure sensor 104) changes the cross-sensitivity of a given pressure sensor 104 to acceleration.

FIG. 3C is a diagram of an example illustrating a correlation of cross-sensitivity with pressure deviation (i.e., drift) due to contamination of pressure sensor 104. As shown in FIG. 3C, with contamination of pressure sensor 104, a pressure signal changes as a function of acceleration. FIG. 3C illustrates that a pressure sensor 104 with comparatively heavier contamination has a comparatively larger pressure deviation. For example, as illustrated in FIG. 3C, with increasing cross-sensitivity (resulting from increasing contamination), the magnitude of the pressure deviation increases. The shaded region in FIG. 3C is meant to indicate ranges of cross-sensitivity and pressure deviations in which contamination could be reliably detected based on cross-sensitivity of pressure sensor 104.

As indicated above, FIGS. 3A-3C are provided merely as examples. Other examples may differ from what is described with regard to FIGS. 3A-3C.

Figure 4:
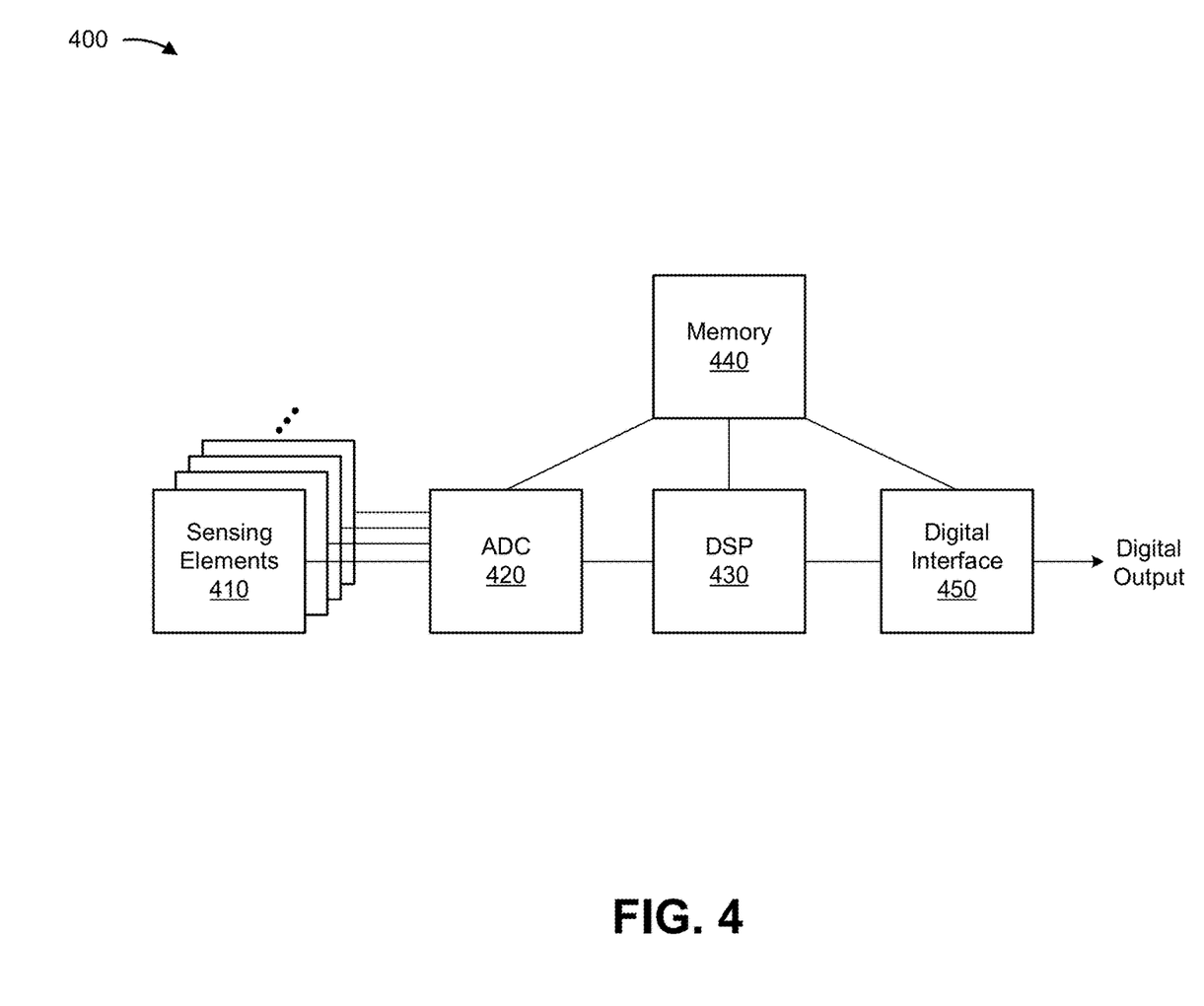
FIG. 4 is a diagram illustrating example components of a sensor described herein.

FIG. 4 is a diagram illustrating example components of a sensor 400. Sensor 400 may correspond to acceleration sensor 102, pressure sensor 104, and/or temperature sensor 106. As shown, sensor 400 may include sensing elements 410, an analog-to-digital convertor (ADC) 420, a digital signal processor (DSP) 430, a memory element 440, and/or a digital interface 450. In some implementations, any combination of at least two of acceleration sensor 102, pressure sensor 104, and temperature sensor 106 may be included in a single sensor 400. Alternatively, acceleration sensor 102, pressure sensor 104, and/or temperature sensor 106 may be included in separate sensors 400.

Sensing element 410 includes an element that provides sensing functionality associated with sensor 400. For example, when sensor 400 comprises pressure sensor 104, sensing element 410 may include a pressure-sensitive mechanical structure (e.g., a membrane) and/or one or more other components associated with providing pressure sensing functionality. As another example, when sensor 400 comprises acceleration sensor 102, sensing element 410 may include an acceleration-sensitive mechanical structure (e.g., a flexible arm) and/or one or more other components associated with providing acceleration sensing functionality. As another example, when sensor 400 comprises temperature sensor 106, sensing element 410 may include a temperature sensitive element (e.g., a thermistor, a resistance thermometer, a thermocouple, a semiconductor-based temperature sensing element, and/or the like) and/or one or more other components associated with providing temperature sensing functionality. In some implementations, sensor 400 may include different types of sensing elements 410 (e.g., when sensor 400 comprises a combination of at least two of acceleration sensor 102, pressure sensor 104, and temperature sensor 106).

ADC 420 includes one or more analog-to-digital converters that convert analog signals from sensing elements 410 to digital signals. For example, ADC 420 may convert an analog signal received from sensing element 410 to a digital signal to be processed by DSP 430. In some implementations, ADC 420 may provide a digital signal to DSP 430. In some implementations, sensor 400 may include one or more ADCs 420.

DSP 430 may include a digital signal processing device or a collection of digital signal processing devices. In some implementations, DSP 430 may receive digital signals from ADC 420 and may process the digital signals in association detecting contamination of pressure sensor 104, as described herein. In some implementations, DSP 430 may process the digital signals in order to form output signals, such as output signals associated with a property (e.g., pressure, acceleration, temperature, and/or the like) sensed by sensor 400.

Memory element 440 includes a read only memory (ROM) (e.g., an EEPROM), a random access memory (RAM), and/or another type of dynamic or static storage device (e.g., a flash memory, a magnetic memory, an optical memory, etc.) that stores information and/or instructions for use by sensor 400, as described herein. In some implementations, memory element 440 may store information associated with processing performed by DSP 430. Additionally, or alternatively, memory element 440 may store configurational values or parameters for sensing element 410 and/or information for one or more other components of sensor 400, such as ADC 420 or digital interface 450.

Digital interface 450 may include an interface via which sensor 400 may receive and/or provide information from and/or to another device, such as contamination detector device 108. For example, digital interface 450 may provide the output signal determined by DSP 430 to contamination detector device 108, and may receive information from contamination detector device 108 and/or a controller via digital interface 450.

The number and arrangement of components shown in FIG. 4 are provided as an example. In practice, there may be additional components, fewer components, different components, or differently arranged components than those shown in FIG. 4. Furthermore, two or more components shown in FIG. 4 may be implemented within a single component, or a single component shown in FIG. 4 may be implemented as multiple, distributed components. Additionally, or alternatively, a set of components (e.g., one or more components) shown in FIG. 4 may perform one or more functions described as being performed by another set of components.

Figure 5:
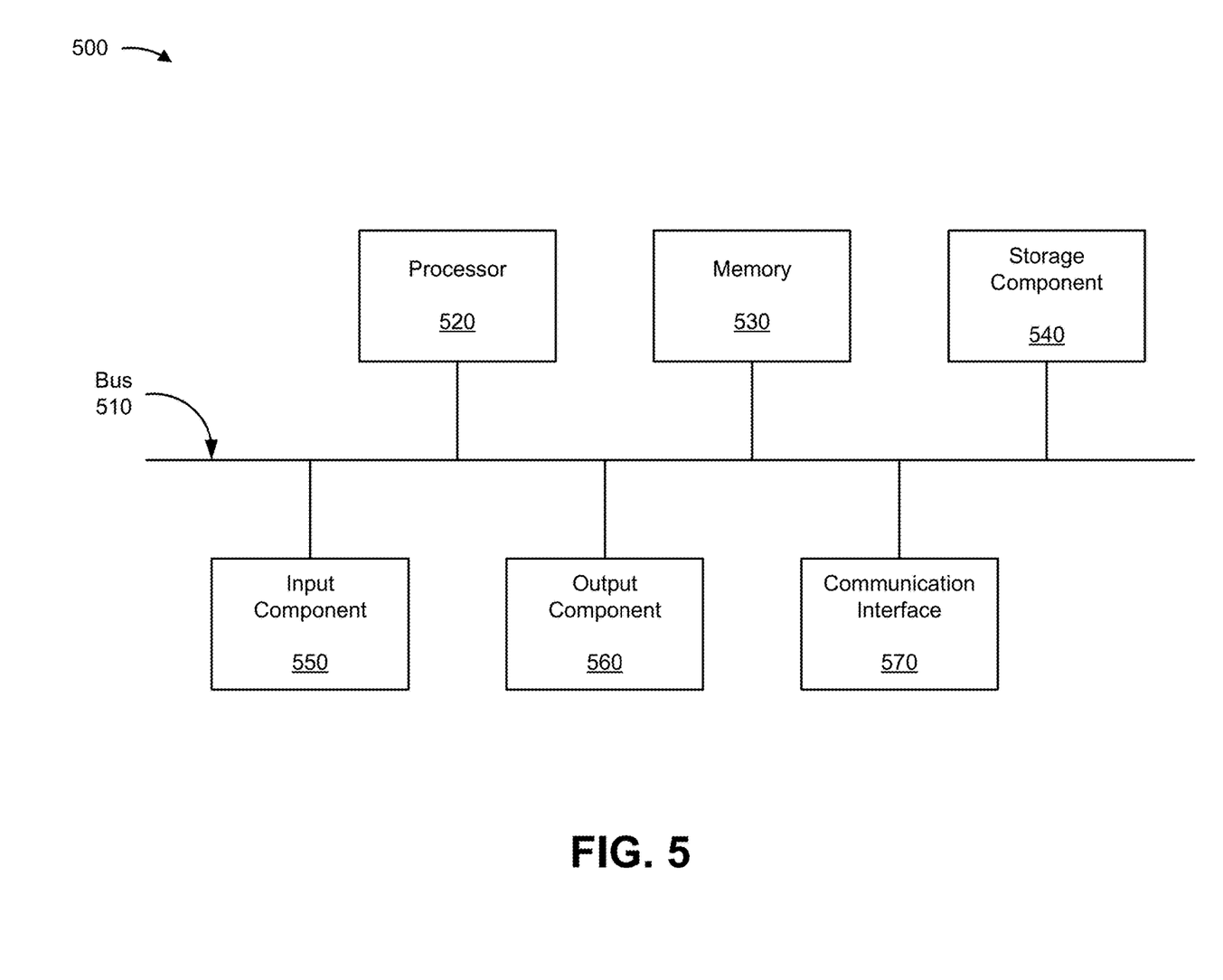
FIG. 5 is a diagram illustrating example components of a contamination detector device described herein.

FIG. 5 is a diagram of example components of a device 500. Device 500 may correspond to contamination detector device 108. In some implementations, contamination detector device 108 may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among multiple components of device 500. Processor 520 is implemented in hardware, firmware, and/or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a component for determining location (e.g., a global positioning system (GPS) component) and/or a sensor (e.g., an accelerometer, a gyroscope, an actuator, another type of positional or environmental sensor, and/or the like). Output component 560 includes a component that provides output information from device 500 (via, e.g., a display, a speaker, a haptic feedback component, an audio or visual indicator, and/or the like).

Communication interface 570 includes a transceiver-like component (e.g., a transceiver, a separate receiver, a separate transmitter, and/or the like) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, a radio frequency (RF) interface, a universal serial bus (USB) interface, a Wi-Fi interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. As used herein, the term "computer-readable medium" refers to a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
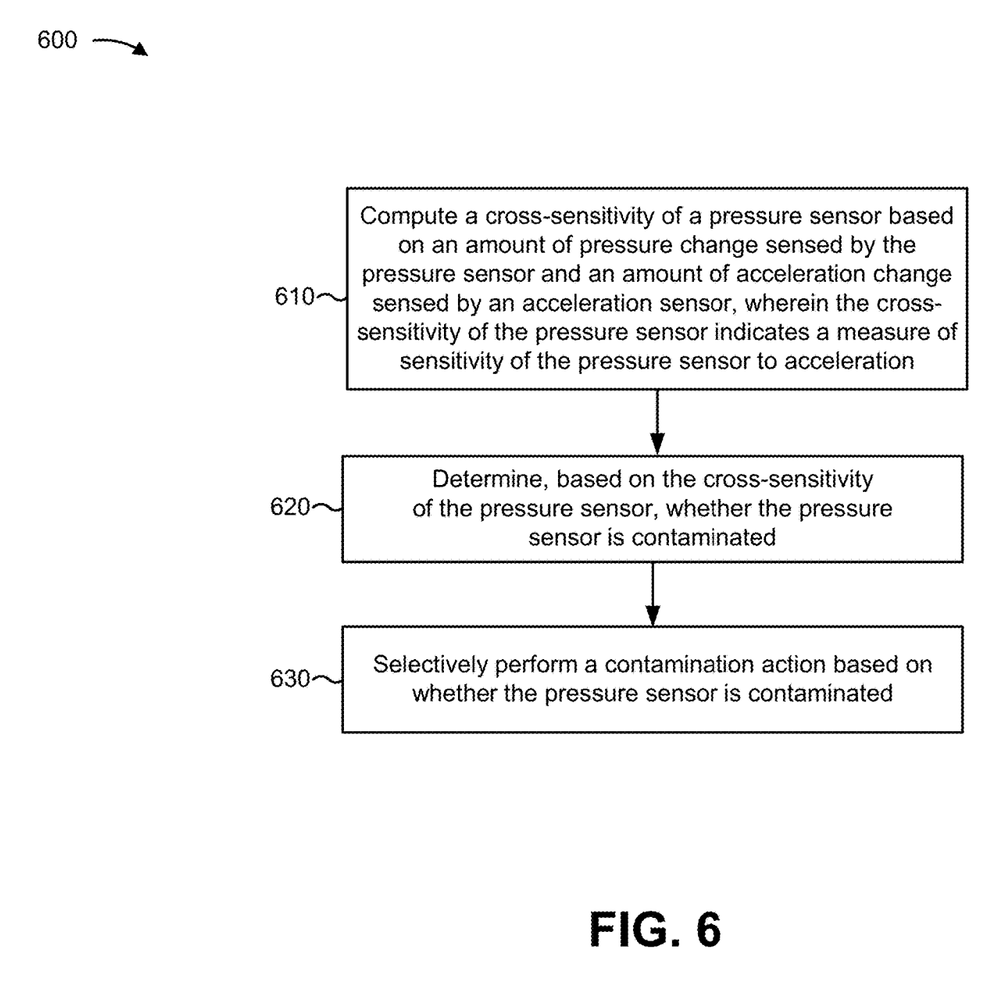
FIG. 6 is a flow chart of an example process for detecting contamination of a pressure sensor based on cross-sensitivity to acceleration, as described herein.

FIG. 6 is a flow chart of an example process 600 for detecting contamination of a pressure sensor (e.g., pressure sensor 104) based on cross-sensitivity to acceleration, as described herein. In some implementations, one or more process blocks of FIG. 6 may be performed by a contamination detector device (e.g., contamination detector device 108). Additionally, or alternatively, one or more process blocks of FIG. 6 may be performed by another device, such as a controller (e.g., a controller of system 100).

As shown in FIG. 6, process 600 may include computing a cross-sensitivity of a pressure sensor based on an amount of pressure change sensed by the pressure sensor and an amount of acceleration change sensed by an acceleration sensor (block 610). For example, the contamination detector device (e.g., using processor 520, memory 530, and/or the like) may compute a cross-sensitivity of a pressure sensor (e.g., pressure sensor 104) based on an amount of pressure change sensed by the pressure sensor and an amount of acceleration change sensed by an acceleration sensor (e.g., acceleration sensor 102), as described above. In some implementations, the cross-sensitivity of the pressure sensor indicates a measure of sensitivity of the pressure sensor to acceleration, as described above.

As further shown in FIG. 6, process 600 may include determining, based on the cross-sensitivity of the pressure sensor, whether the pressure sensor is contaminated (block 620). For example, the contamination detector device (e.g., using processor 520, memory 530, and/or the like) may determine, based on the cross-sensitivity of the pressure sensor, whether the pressure sensor is contaminated, as described above.

As further shown in FIG. 6, process 600 may include selectively performing, by the device, a contamination action based on whether the pressure sensor is contaminated (block 630). For example, the contamination detector device (e.g., using processor 520, memory 530, and/or the like) may selectively perform a contamination action based on whether the pressure sensor is contaminated, as described above.

Process 600 may include additional implementations, such as any single implementation or any combination of implementations described below and/or in connection with one or more other processes described elsewhere herein.

In some implementations, the amount of pressure change is determined based on a temperature corrected amount of pressure. Here, the contamination detector device may determine a first amount of pressure sensed by the pressure sensor; determine a second amount of pressure sensed by the pressure sensor; and correct the first amount of pressure based on a first temperature, associated with the first amount of pressure, and a second temperature associated with the second amount of pressure. A result of correcting the first amount of pressure is the temperature corrected amount of pressure.

In some implementations, when computing the cross-sensitivity of the pressure sensor, the contamination detector device may divide the amount of pressure change by the amount of acceleration change, a result of which is the cross-sensitivity of the pressure sensor.

In some implementations, the amount of pressure change is a difference between a reference pressure and a test pressure, and the amount of acceleration change is a difference between a reference acceleration and a test acceleration. Here, the reference pressure is associated with the reference acceleration and the test pressure is associated with the test acceleration. In some implementations, the reference acceleration is approximately equal to zero.

In some implementations, the contamination detector device may determine whether a difference between the measure of the cross-sensitivity and a calibration cross-sensitivity satisfies a cross-sensitivity threshold. Here, when determining whether the pressure sensor is contaminated, the contamination detector device may determine whether the pressure sensor is contaminated based on whether the difference between the measure of the cross-sensitivity and the calibration cross-sensitivity satisfies the cross-sensitivity threshold. In some implementations, the calibration cross-sensitivity is determined as a result of a calibration procedure performed during production of the pressure sensor (e.g., in a factory or production area).

In some implementations, the contamination action comprises providing an indication that the pressure sensor is contaminated; or performing contamination compensation associated with the pressure sensor.

In some implementations, the contamination detector device may determine that an amount of acceleration satisfies an acceleration threshold. Here, the contamination detector device, when computing the cross-sensitivity of the pressure sensor, may compute the cross-sensitivity of the pressure sensor based on determining that the amount of acceleration satisfies the acceleration threshold.

In some implementations, the pressure sensor is included in a tire pressure monitoring system or an air bag sensor system.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
   computing, by a device, a cross-sensitivity of a pressure sensor based on an amount of pressure change sensed by the pressure sensor and an amount of acceleration change sensed by an acceleration sensor,
   wherein the cross-sensitivity of the pressure sensor indicates a measure of sensitivity of the pressure sensor to acceleration;
   determining, by the device and based on the cross-sensitivity of the pressure sensor, whether the pressure sensor is contaminated; and
   selectively performing, by the device, a contamination action based on whether the pressure sensor is contaminated.

2. The method of claim 1, wherein the amount of pressure change is determined based on a temperature corrected amount of pressure, and wherein the method further comprises:
   determining a first amount of pressure sensed by the pressure sensor;
   determining a second amount of pressure sensed by the pressure sensor; and
   correcting the first amount of pressure based on a first temperature, associated with the first amount of pressure, and a second temperature associated with the second amount of pressure,
      wherein a result of correcting the first amount of pressure is the temperature corrected amount of pressure.

3. The method of claim 1, wherein computing the cross-sensitivity of the pressure sensor comprises:
   dividing the amount of pressure change by the amount of acceleration change, a result of which is the cross-sensitivity of the pressure sensor.

4. The method of claim 1, wherein the amount of pressure change is a difference between a reference pressure and a test pressure, and the amount of acceleration change is a difference between a reference acceleration and a test acceleration,
   wherein the reference pressure is associated with the reference acceleration and the test pressure is associated with the test acceleration.

5. The method of claim 4, wherein the reference acceleration is approximately equal to zero.

6. The method of claim 1, further comprising:
   determining whether a difference between a measure of the cross-sensitivity and a calibration cross-sensitivity satisfies a cross-sensitivity threshold; and
   wherein determining whether the pressure sensor is contaminated comprises:
      determining whether the pressure sensor is contaminated based on whether the difference between the measure of the cross-sensitivity and the calibration cross-sensitivity satisfies the cross-sensitivity threshold.

7. The method of claim 6, wherein the calibration cross-sensitivity is determined as a result of a calibration procedure performed during production of the pressure sensor.

8. The method of claim 1, wherein the contamination action comprises at least one of:
   providing an indication that the pressure sensor is contaminated; or
   performing contamination compensation associated with the pressure sensor.

9. The method of claim 1, further comprising:
   determining that an amount of acceleration satisfies an acceleration threshold; and
   wherein computing the cross-sensitivity of the pressure sensor comprises:
      computing the cross-sensitivity of the pressure sensor based on determining that the amount of acceleration satisfies the acceleration threshold.

10. The method of claim 1, wherein the pressure sensor is included in a tire pressure monitoring system.

11. A contamination detector device, comprising:
   one or more memories; and
   one or more processors, communicatively coupled to the one or more memories, to:
      compute a cross-sensitivity of a pressure sensor, the cross-sensitivity indicating a measure of sensitivity of the pressure sensor to acceleration experienced by the pressure sensor,
         wherein the cross-sensitivity is determined based on an amount of pressure change sensed by the pressure sensor and an amount of acceleration change sensed by an acceleration sensor;
      determine whether the pressure sensor is contaminated based on comparing the cross-sensitivity and a cross-sensitivity threshold; and
      selectively perform a contamination action based on whether the pressure sensor is contaminated.

12. The contamination detector device of claim 11, wherein the amount of pressure change is determined based on a temperature corrected amount of pressure, and wherein the one or more processors are further to:
   determine a first amount of pressure sensed by the pressure sensor;
   determine a second amount of pressure sensed by the pressure sensor; and
   correct the first amount of pressure based on a first temperature, associated with the first amount of pressure, and a second temperature associated with the second amount of pressure,
      wherein a result of correcting the first amount of pressure is the temperature corrected amount of pressure.

13. The contamination detector device of claim 11, wherein the one or more processors, when computing the cross-sensitivity of the pressure sensor, are to:
   divide the amount of pressure change by the amount of acceleration change, a result of which is the cross-sensitivity of the pressure sensor.

14. The contamination detector device of claim 11, wherein the cross-sensitivity threshold is determined as a result of a calibration procedure.

15. The contamination detector device of claim 11, wherein the contamination action comprises at least one of:
   providing an indication that the pressure sensor is contaminated; or
   performing contamination compensation associated with the pressure sensor.

16. The contamination detector device of claim 11, wherein the one or more processors are further to:
   determine that an amount of acceleration satisfies an acceleration threshold; and
   wherein the one or more processors, when computing the cross-sensitivity of the pressure sensor, are to:
      compute the cross-sensitivity of the pressure sensor based on determining that the amount of acceleration satisfies the acceleration threshold.

17. A system, comprising:
   a pressure sensor;
   an acceleration sensor; and
   a contamination detector device to:
      compute a cross-sensitivity of the pressure sensor based on an amount of pressure change, determined based on measurements by the pressure sensor, and an amount of acceleration determined based on measurements by the acceleration sensor,
         wherein the cross-sensitivity indicates a measure of sensitivity of the pressure sensor to acceleration;
      determine whether the pressure sensor is contaminated based on the cross-sensitivity of the pressure sensor; and selectively perform a contamination action based on whether the pressure sensor is contaminated.

18. The system of claim 17, wherein the amount of pressure change is determined based on a temperature corrected amount of pressure, and wherein the contamination detector device is further to:
- determine a first amount of pressure sensed by the pressure sensor;
- determine a second amount of pressure sensed by the pressure sensor; and
- correct the first amount of pressure based on a first temperature, associated with the first amount of pressure, and a second temperature associated with the second amount of pressure,
  - wherein a result of correcting the first amount of pressure is the temperature corrected amount of pressure.

19. The system of claim 17, wherein the contamination detector device, when computing the cross-sensitivity of the pressure sensor, is to:
- divide the amount of pressure change by an amount of acceleration change, a result of which is the cross-sensitivity of the pressure sensor.

20. The system of claim 17, wherein the contamination detector device is further to:
- determine that the amount of acceleration satisfies an acceleration threshold; and
- wherein the contamination detector device, when computing the cross-sensitivity of the pressure sensor, is to:
  - compute the cross-sensitivity of the pressure sensor based on determining that the amount of acceleration satisfies the acceleration threshold.

* * * * *